(12) United States Patent
Jeon (10) Patent No.: US 9,871,082 B2
(45) Date of Patent: Jan. 16, 2018

(54) ORGANIC LIGHT EMITTING DISPLAY INTEGRATED WITH TOUCH SCREEN PANEL

(71) Applicant: SAMSUNG DISPLAY CO., LTD., Yongin, Gyeonggi-Do (KR)

(72) Inventor: Mu-Kyung Jeon, Yongin (KR)

(73) Assignee: Samsung Display Co., Ltd., Yongin, Gyunggi-do (KR)

( * ) Notice: Subject to any disclaimer, the term of this patent is extended or adjusted under 35 U.S.C. 154(b) by 172 days.

(21) Appl. No.: 14/152,337

(22) Filed: Jan. 10, 2014

(65) Prior Publication Data

US 2014/0198067 A1    Jul. 17, 2014

(30) Foreign Application Priority Data

Jan. 16, 2013  (KR) .......................... 10-2013-0005047

(51) Int. Cl.
    *G06F 3/041*    (2006.01)
    *H01L 27/32*    (2006.01)
    *G06F 3/044*    (2006.01)

(52) U.S. Cl.
    CPC ............ *H01L 27/323* (2013.01); *G06F 3/044* (2013.01); *G06F 3/0412* (2013.01); *G06F 3/0416* (2013.01); *H01L 27/3276* (2013.01)

(58) Field of Classification Search
None
See application file for complete search history.

(56) References Cited

U.S. PATENT DOCUMENTS

| | | | |
|---|---|---|---|
| 2005/0017934 A1* | 1/2005 | Chung ................. | G09G 3/3233 345/82 |
| 2006/0077162 A1* | 4/2006 | Chou ................. | G02F 1/136204 345/92 |
| 2008/0211395 A1* | 9/2008 | Koshihara et al. ........... | 313/504 |
| 2010/0182272 A1* | 7/2010 | Kang et al. .................... | 345/174 |

(Continued)

FOREIGN PATENT DOCUMENTS

| CN | 101211246 A | 7/2008 |
|---|---|---|
| CN | 101635304 A | 1/2010 |

(Continued)

OTHER PUBLICATIONS

Office Action was issued from the Chinese Patent Office dated Apr. 1, 2017 with respect to Chinese Patent Application No. 201410021541.2.

*Primary Examiner* — Ilana Spar
*Assistant Examiner* — Kirk Hermann
(74) *Attorney, Agent, or Firm* — Lee & Morse, P.C.

(57) ABSTRACT

An organic light emitting display integrated with a touch screen panel includes a first substrate, the first substrate having pixels and having signal lines coupled to the pixels, and a second substrate, the second substrate being on the first substrate to seal the first substrate, the second substrate having sensing electrodes of the touch screen panel on a surface thereof. The signal lines include first and second signal lines, the first and second signal lines being arranged in a direction that intersects the sensing electrodes, the first and second signal lines receiving different signals, respectively, and functioning as first and second driving electrodes of the touch screen panel.

17 Claims, 4 Drawing Sheets

(56) References Cited

U.S. PATENT DOCUMENTS

| | | | |
|---|---|---|---|
| 2011/0242021 A1* | 10/2011 | Jun | ............... G06F 3/044 |
| | | | 345/173 |
| 2012/0001896 A1 | 1/2012 | Han et al. | |
| 2012/0113064 A1* | 5/2012 | White | ............ G06F 3/0418 |
| | | | 345/178 |
| 2012/0218199 A1* | 8/2012 | Kim | ............. G06F 3/0412 |
| | | | 345/173 |
| 2012/0249454 A1* | 10/2012 | Teraguchi | ...... G06F 3/0412 |
| | | | 345/173 |
| 2013/0321292 A1 | 12/2013 | Jeon | |
| 2014/0146026 A1* | 5/2014 | Yu et al. | ............... 345/208 |
| 2015/0153398 A1* | 6/2015 | Bakken | ......... G01R 27/2605 |
| | | | 702/65 |

FOREIGN PATENT DOCUMENTS

| | | |
|---|---|---|
| CN | 102299166 A | 12/2011 |
| KR | 10-2010-0061993 A | 6/2010 |
| KR | 10-2012-0008085 | 1/2012 |
| KR | 10-2013-0136187 | 12/2013 |
| WO | WO 2013012667 A1 * | 1/2013 ........... G06F 1/1601 |

* cited by examiner

ORGANIC LIGHT EMITTING DISPLAY INTEGRATED WITH TOUCH SCREEN PANEL

CROSS-REFERENCE TO RELATED APPLICATION

This application claims priority to and the benefit of Korean Patent Application No. 10-2013-0005047, filed on Jan. 16, 2013, in the Korean Intellectual Property Office, and entitled: "Organic Light Emitting Display Integrated With Touch Screen Panel," which is incorporated by reference herein in its entirety.

BACKGROUND

1. Field

Embodiments relate to an organic light emitting display integrated with a touch screen panel.

2. Description of the Related Art

A touch screen panel is an input device for selecting indicated content displayed on the screen of an image display device, e.g., by a human hand or an object, to input the command of a user. The touch screen panel may be provided on the front face of the image display device to convert a contact position of the human hand or the object into an electrical signal. The indicated content selected in the contact position may be received as an input signal. Since the touch screen panel may replace an additional input device coupled to the image display device to operate such as a keyboard and a mouse, the range of use is gradually increasing.

SUMMARY

Embodiments are directed to an organic light emitting display integrated with a touch screen panel, the display including a first substrate, the first substrate having pixels and having signal lines coupled to the pixels, and a second substrate, the second substrate being on the first substrate to seal the first substrate, the second substrate having sensing electrodes of the touch screen panel on a surface thereof. The signal lines may include first and second signal lines, the first and second signal lines being arranged in a direction that intersects the sensing electrodes, the first and second signal lines receiving different signals, respectively, and functioning as first and second driving electrodes of the touch screen panel.

The first signal lines may be initialization driving control lines coupled to the pixels and the second signal lines may be scan lines coupled to the pixels.

A plurality of adjacent initialization driving control lines may form a group, and the plurality of initialization driving control lines that form the group may operate as first driving electrodes of the touch screen panel.

Scan lines for providing previous scan signals or next scan signals of pixels corresponding thereto may operate as second driving electrodes of the touch screen panel.

The sensing electrodes may be disposed in a display region of the second substrate, corresponding to a region in which the pixels are formed.

Sensing lines for coupling the sensing electrodes to a touch driving circuit through a touch pad unit may be disposed in a non-display region positioned outside the display region.

The sensing lines may be coupled to the touch driving circuit through a driving pad unit disposed in a non-display region of the first substrate.

The touch pad unit may be disposed on the second substrate and may be coupled to the same touch driving circuit as the driving pad unit disposed on the first substrate.

Each of the pixels may include an organic light emitting diode (OLED) coupled between a first power supply and a second power supply, a first transistor coupled between the first power supply and the OLED, a second transistor coupled between a first electrode of the first transistor and a data line, a third transistor coupled between a second electrode of the first transistor and a gate electrode of the first transistor, a fourth transistor coupled between the second electrode of the first transistor and the OLED, a fifth transistor coupled between the gate electrode of the first transistor and an initialization driving control line, the initialization driving control line being coupled to a third power supply that is an initializing power supply, a sixth transistor coupled between a second electrode of the fourth transistor and the third power supply, the sixth transistor having a gate electrode thereof coupled to a scan line, a seventh transistor coupled between the first power supply and the first electrode of the first transistor, and a storage capacitor coupled between the first power supply and the gate electrode of the first transistor.

The initializing power supply applied to the initialization driving control line may have a lower level voltage than that of a data signal applied to each of the pixels.

The initializing power supply may be sequentially applied to respective groups of initialization driving control lines that operate as first driving electrodes of the touch screen panel.

A high level voltage may be applied to groups of initialization driving control lines except for a group of initialization driving control lines to which the initializing power supply is applied.

A scan signal that is applied to the scan line coupled to the gate electrode of the sixth transistor may be sequentially applied to scan lines that operate as second driving electrodes of the touch screen panel.

Cathode electrodes of the OLEDs may be interposed between a plurality of initialization driving control lines and scan lines arranged on the first substrate and the sensing electrodes arranged on the surface of a second substrate, and apertures may be formed in regions of the cathode electrodes that overlap the initialization driving control lines and the scan lines so that the initialization driving control lines and the scan lines are exposed.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "on" another element, it can be directly on the other element, or one or more intervening elements may also be present. It will also be understood that when an element is referred to as being "under" another element, it can be directly under, or one or more intervening elements may also be present. It will also be understood that when an element is referred to as being "between" two elements, it can be the only element between the two elements, or one or more intervening elements may also be present. Like reference numerals refer to like elements throughout.

Figure 1:
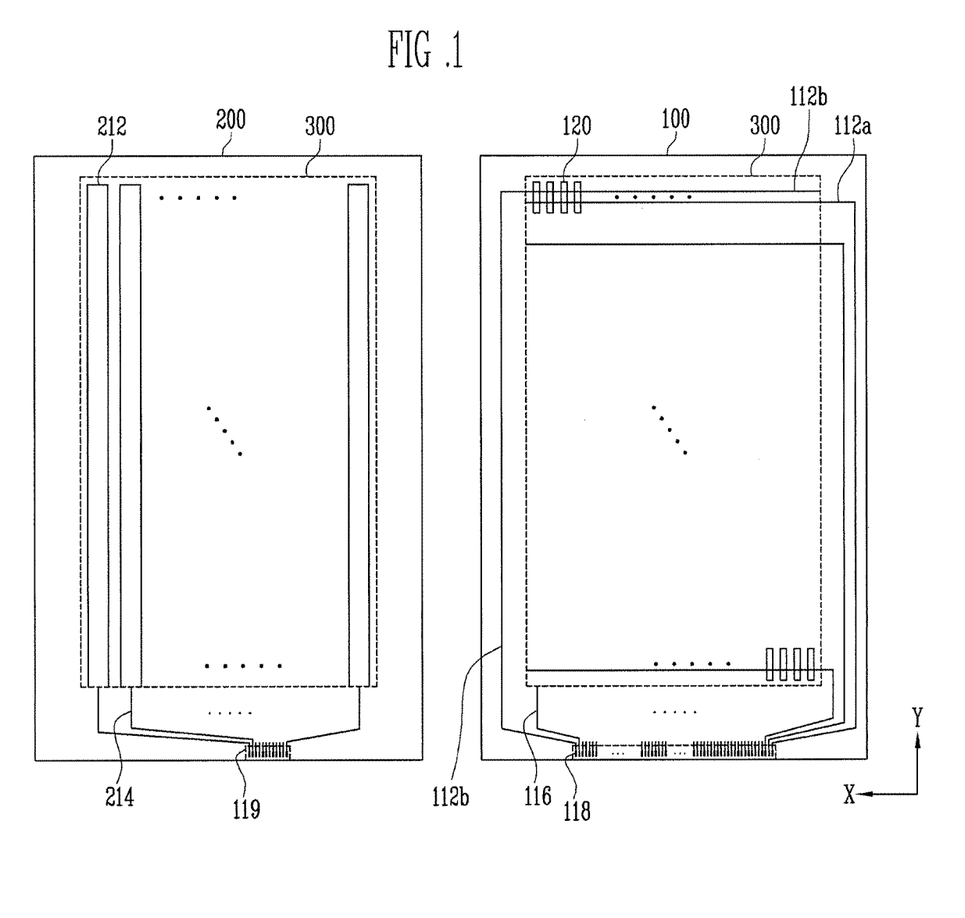
FIG. 1 is an exploded plan view of an organic light emitting display integrated with a touch screen panel according to an example embodiment.

FIG. 1 is an exploded plan view of an organic light emitting display integrated with a touch screen panel according to an example embodiment.

In an organic light emitting display integrated with a touch screen panel according to the present example embodiment, sensing electrodes 212 of the touch screen panel are directly formed on one surface of a top substrate 200 of the organic light emitting display, and driving electrodes of the touch screen panel are realized by signal lines 112a and 112b arranged on a bottom substrate 100 of the organic light emitting display.

The top substrate 200 may function as an encapsulation substrate of the organic light emitting display, and may be formed of a glass material or a flexible thin film.

One surface of the top substrate 200 may be the external surface of the top substrate so that the one surface of the top substrate illustrated in FIG. 1 corresponds to the external surface of the top substrate.

The above is an example embodiment, but embodiments are not limited thereto. For example, the sensing electrodes 212 of the touch screen panel may be formed on the internal surface of the top substrate 200.

The structure of the present example embodiment will be described in detail with reference to FIG. 1.

In the organic light emitting display integrated with the touch screen panel according to the present example embodiment, sensing electrodes 212 of the touch screen panel and sensing lines 214 for coupling the sensing electrodes 212 to an external touch driving circuit (not shown) through a touch pad unit 119 are formed on one surface of the top substrate 200 that seals up the bottom substrate 100 for a plurality of pixels 120 formed in a display region 300 of the bottom substrate 100.

In the present example embodiment, the sensing electrodes 212 are formed in the display region 300 and the sensing lines 214 are formed in a non-display region positioned outside the display region 300.

In addition, a plurality of signal lines are coupled to the pixels 120 formed in the display region 300 of the bottom substrate 100. In FIG. 1, scan lines 112b, data lines 116, and initialization driving control lines 112a are arranged as signal lines. Emission control lines may be additionally coupled to the pixels 120. However, for convenience sake, the emission control lines are not illustrated.

In the present example embodiment, the initialization driving control lines 112a are arranged in a first direction (an X axis direction) to run parallel with the scan lines 112b. The plurality of pixels are formed in row lines like the scan lines and are coupled to the initialization driving control lines, respectively.

In addition, the scan lines 112b, the data lines 116, and the initialization driving control lines 112a are coupled to a pad unit 118.

According to the present example embodiment, the driving electrodes of the touch screen panel (which correspond to the sensing electrodes 212 of the touch screen panel formed on one surface of the top substrate 200) are used as the signal lines 112a and 112b (which are arranged on the bottom substrate 100). The signal lines 112a and 112b are the initialization driving control lines 112a and the scan lines 112b. Thus, the initialization driving control lines 112a are used as first driving electrodes of the touch screen panel and the scan lines 112b are used as second driving electrodes of the touch screen panel.

As illustrated in FIG. 1, the initialization driving control lines 112a and the scan lines 112b (as the first and second driving electrodes) and the sensing electrodes 212 are arranged to intersect each other so that a plurality of sensing cells are formed at the intersections. For example, when the sensing electrodes 212 are arranged in a second direction (a Y axis direction), the driving electrodes 112a and 112b are arranged in the first direction (the X axis direction) that intersects the second direction (the Y axis direction).

The pad unit 118 provides scan signals and data signals to the pixels 120, and provides driving signals to the first and second driving electrodes of the touch screen panel. In an implementation, the pad unit 118 receives signals from a scan driving circuit, a data driving circuit, and a touch driving circuit (which are external driving circuits).

In the present example embodiment, touch pad unit 119 formed on the top substrate 200 is coupled to the same touch driving circuit (not shown) as the pad unit 118 formed on the bottom substrate 100 so that the sensing signals from the sensing electrodes 212 of the touch screen panel formed on the top substrate 200 may be provided to the touch driving circuit. For example, when the touch driving circuit is electrically coupled to the pad unit 118 (formed on the bottom substrate) by a flexible printed circuit board (FPCB), the touch pad unit 119 (formed on the top substrate) is coupled to the pad unit 118 through a conductive coupling member (e.g., a conductive ball (not shown)) so that electric coupling to the touch driving circuit may be performed without an additional FPCB contacting the touch pad unit 119.

As illustrated in FIG. 1, the sensing electrodes 212 formed on the top substrate 200 may have a much larger width than that of the first and second driving electrodes 112a and 112b formed on the bottom substrate 100. Thus, touch recognition sensitivity may be somewhat less in comparison with a touch screen panel in which the sensing electrodes and the driving electrodes have a same width.

According to the present example embodiment, a plurality of initialization driving control lines 112a (the first driving electrodes) that are adjacent form a group. The plurality of initialization driving control lines 112a that form the group may operate as the first driving electrodes. In an implementation, the first driving electrodes 112a (formed of the plurality of initialization driving control lines) may form a group, and the scan lines 112b may function as the second driving electrodes. Thus, the touch recognition sensitivity may be improved.

In order to realize touch recognition through the sensing cells, during touch recognition, signals applied to the group of the initialization driving control lines 112a and the scan lines 112*b* (which operate as the first and second driving electrodes) are input in synchronization with signals applied to the pixels so as not to affect display.

The pixel structure of a pixel according to the present example embodiment for realizing the above and waveforms of the driving signals supplied to the pixel will be described in detail with reference to FIGS. 2 and 3.

Figure 2:
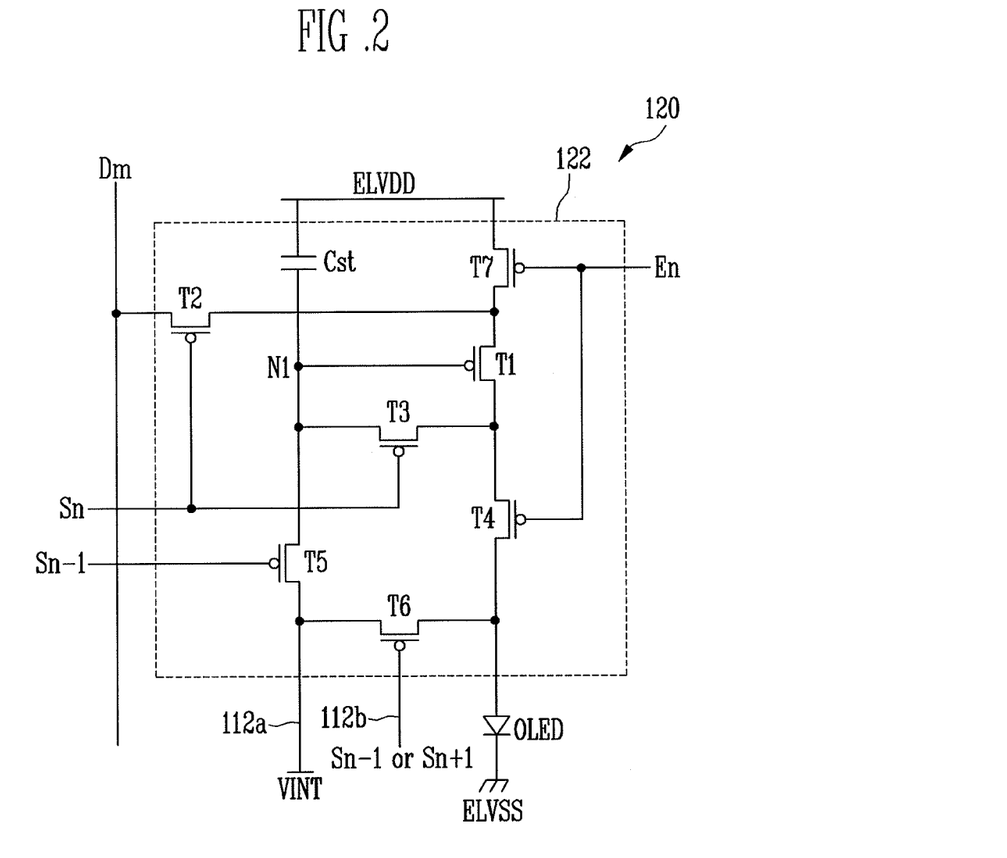
FIG. 2 is a circuit diagram of an embodiment of the pixel illustrated in FIG. 1.

FIG. 2 is a circuit diagram of an embodiment of the pixel illustrated in FIG. 1. FIG. 3 is a waveform diagram of driving signals supplied to the pixel illustrated in FIG. 2.

For convenience sake, in FIG. 2, a pixel positioned in an nth (n is a natural number) horizontal line and coupled to an mth data line Dm will be described.

A pixel 120 according to the present example embodiment includes an organic light emitting diode (OLED) and a pixel circuit 122 coupled to a data line Dm, scan lines Sn and Sn−1 or Sn+1, an emission control line En, and an initialization driving control line 112*a* for supplying a third power supply VINT that is an initializing power supply to control an amount of current supplied to the OLED.

The scan lines may include a previous scan line Sn−1 coupled to the gate electrode of an initialization driving transistor T5. The scan lines may include a previous scan line Sn−1 or a next scan line Sn+1 coupled to the gate electrode of a transistor T6 for preventing black brightness of the OLED from increasing. The scan lines may include a current scan line Sn coupled to the gate electrode of a switching transistor T2 included in the pixel circuit 122.

The scan lines 112*b* as the second driving electrodes (described in FIG. 1) are the previous scan line Sn−1 or the next scan line Sn+1 coupled to the gate electrode of the transistor T6 for preventing the black brightness of the OLED from increasing as illustrated in FIG. 2.

In the present example embodiment, the anode electrode of the OLED is coupled to a pixel circuit 142 and the cathode electrode of the OLED is coupled to a second power supply ELVSS. The voltage value of the second power supply ELVSS is set to be smaller than the voltage value of a first power supply ELVDD. The OLED generates light with predetermined brightness to correspond to the amount of current supplied from the pixel circuit 122. The pixel circuit 142 controls the amount of current supplied to the OLED to correspond to a data signal supplied to the data line Dm when a scan signal is supplied to the current scan line Sn.

In the present example embodiment, the pixel circuit 142 includes first to seventh transistors T1 to T7 and a storage capacitor Cst. Referring to FIG. 2, the pixel 120 according to the present example embodiment includes the OLED coupled between the first power supply ELVDD and the second power supply ELVSS, a first transistor T1 coupled between the first power supply ELVDD and the OLED, a second transistor T2 coupled between the first electrode of the first transistor T1 and the data line Dm, a third transistor T3 coupled between the second electrode of the first transistor T1 and the gate electrode of the first transistor T1, a fourth transistor T4 coupled between the second electrode of the first transistor t1 and the OLED, a fifth transistor T5 coupled between the gate electrode of the first transistor t1 and the third power supply VINT as the initializing power supply, a sixth transistor T6 coupled between the second electrode of the fourth transistor T4 and the third power supply VINT, a seventh transistor T7 coupled between the first power supply ELVDD and the first electrode of the first transistor T1, and a storage capacitor Cst coupled between the first power supply ELVDD and the gate electrode of the first transistor T1.

In the present example embodiment, the first electrode of the first transistor T1 is coupled to the first power supply ELVDD via the seventh transistor T7 and the second electrode of the first transistor T1 is coupled to the OLED via the fourth transistor T4. The first electrode and the second electrode are different electrodes. For example, when the first electrode is a source electrode, the second electrode is a drain electrode. The gate electrode of the first transistor T1 is coupled to a first node N1. The first transistor T1 that controls driving current supplied to the OLED to correspond to the voltage of the first node N1 functions as the driving transistor of the pixel.

The first electrode of the second transistor T2 is coupled to the data line Dm and the second electrode of the second transistor T2 is coupled to the first electrode of the first transistor T1. The second electrode of the second transistor T2 is coupled to the first node N1 via the first and third transistors T1 and T3 when the first and third transistors T1 and T3 are turned on. The gate electrode of the second transistor T2 is coupled to the current scan line Sn. The second transistor T2 is turned on when the current scan signal is supplied from the current scan line Sn to transmit the data signal supplied from the data line Dm to the inside of the pixel.

The first electrode of the third transistor T3 is coupled to the second electrode of the first transistor T1 and the second electrode of the third transistor T3 is coupled to the first node N1 to which the gate electrode of the first transistor T1 is coupled. The gate electrode of the third transistor T3 is coupled to the current scan line Sn. The third transistor T3 is turned on when the current scan signal is supplied from the current scan line Sn to diode couple the first transistor t1.

The first electrode of the fourth transistor T4 is coupled to the second electrode of the first transistor T1 and the second electrode of the fourth transistor T4 is coupled to the anode electrode of the OLED. The gate electrode of the fourth transistor T4 is coupled to the emission control line En. The fourth transistor T4 is turned on or off to correspond to the emission control signal supplied from the emission control line En to form a current path in the pixel or to prevent the current path from being formed.

The first electrode of the fifth transistor T5 is coupled to the first node N1 and the second electrode of the fifth transistor T5 is coupled to the third power supply VINT. The third power supply VINT as the initializing power supply for supplying the initializing voltage of the pixel may be set as a different voltage source having different potential from that of the second power supply ELVSS to be additionally supplied, or may be set as the same voltage source as that of the second power supply ELVSS. Thus, in accordance with the design structure of the pixel, an additional initializing power supply VINT may be supplied or the second power supply ELVSS may be used as the initializing power supply. The gate electrode of the fifth transistor T5 is coupled to the previous scan line Sn−1. The fifth transistor T5 is turned on when a previous scan signal is supplied from the previous scan line Sn−1 to apply the voltage of the third power supply VINT to the first node N1 and to initialize the first node N1.

The first electrode of the sixth transistor T6 is coupled to the second electrode of the fourth transistor T4 and the second electrode of the sixth transistor T6 is coupled to the third power supply VINT. When the second electrode of the sixth transistor T6 is coupled to the third power supply VINT, the sixth transistor t6 is coupled between the fourth transistor T4 and the third power supply VINT to be coupled to the OLED in parallel. The gate electrode of the sixth transistor T6 is coupled to the previous scan line Sn−1 or the next scan line Sn+1. The sixth transistor T6 is turned on when the previous or next scan signal is supplied from the previous scan line Sn−1 or the next scan line Sn+1 to couple the second electrode of the fourth transistor T4 to the third power supply VINT.

In a period where black brightness is displayed, that is, in a period where the fourth transistor T4 is turned off by the emission control signal, the sixth transistor T6 forms a current path in which leakage current generated by the fourth transistor T4 does not detour to the OLED but detours to the third power supply VINT to prevent the black brightness from increasing.

In the present example embodiment, the previous scan line Sn−1 or the next scan line Sn+1 coupled to the gate electrode of the sixth transistor T6 corresponds to the scan lines 112b as the second driving electrodes described in FIG. 1.

The first electrode of the seventh transistor T7 is coupled to the first power supply ELVDD and the second electrode of the seventh transistor T7 is coupled to the first electrode of the first transistor T1. The gate electrode of the seventh transistor T7 is coupled to the emission control line En. The seventh transistor T7 is turned on or off to correspond to the emission control signal supplied from the emission control line En to form a current path in the pixel or to prevent the current path from being formed.

The storage capacitor Cst is coupled between the first power supply ELVDD and the first node N1 to charge a voltage corresponding to the voltage supplied to the first node N1.

An operation of displaying a predetermined image is performed through the structure of the pixel and application of the signals illustrated in FIG. 2.

In the present example embodiment, the third power supply VINT as the initializing power supply initializes the first node N1. The third power supply VINT has a lower voltage than the data signal. In addition, according to the present example embodiment, the initialization driving control lines 112a to which the initializing power supply is applied function as the first driving electrodes of the touch screen panel. Therefore, the third power supply VINT applied to the initialization driving control lines 112a is not always applied at a lower voltage than that of the data signal but the low voltage is sequentially applied to each predetermined group of the initialization driving control lines 112a that operate as the first driving electrodes as a touch driving signal.

According to the present example embodiment, the first driving electrodes may be formed of a plurality of initialization driving control lines 112a in a group. Also, the previous scan lines Sn−1 or the next scan lines Sn+1 112b coupled to the gate electrode of the sixth transistor T6 may operate as the second driving electrodes of the touch screen panel. For example, in FIG. 3, in the plurality of initialization driving control lines 112 arranged in the first direction (the X axis direction), a plurality, e.g., 40, of the initialization driving control lines form a group to function as a first driving electrode. In addition, the scan lines that function as the second driving electrodes are the previous scan lines Sn−1. However, the present example embodiment is not limited to the above, and the next scan lines Sn+1 may be used as the second driving electrodes.

As described above, according to the present example embodiment, the group of 1st to 40th initialization driving control lines functions as a first driving electrode, the group of 41st to 80th initialization driving control lines functions as a second first driving electrode, and groups each formed of the same number of initialization driving control lines operate as subsequent driving electrodes.

In the present example embodiment, the initialization driving control lines 112 are arranged in the first direction (the X axis direction) to run parallel with the scan lines Sn and Sn−1. The plurality of pixels formed in a row line, like the scan lines, are coupled to the initialization driving control lines, respectively. Therefore, only in a period where the previous scan signal S(n−1) is applied to the 40 row lines coupled to each first driving electrode, the third power supply VINT that is a low level initializing power supply is applied and a high level voltage is applied in the remaining periods. Therefore, as illustrated in FIG. 3, since the low level initialization power supply VINT applied to each of the first driving electrodes is sequentially applied to each group of the initialization driving control lines, the low level initialization power supply VINT may be used as the driving signal of the touch screen panel. In addition, since the low level initialization power supply VINT is applied to the pixels coupled to the row lines to which the previous scan signal S(n−1) is applied, the first node N1 of the pixel illustrated in FIG. 2 may be initialized. Since data is not written in the pixels coupled to the row lines to which the previous scan signal is not applied, the low level initializing power supply VINT is not applied. Although a high level voltage is applied, image display is not affected.

Figure 3:
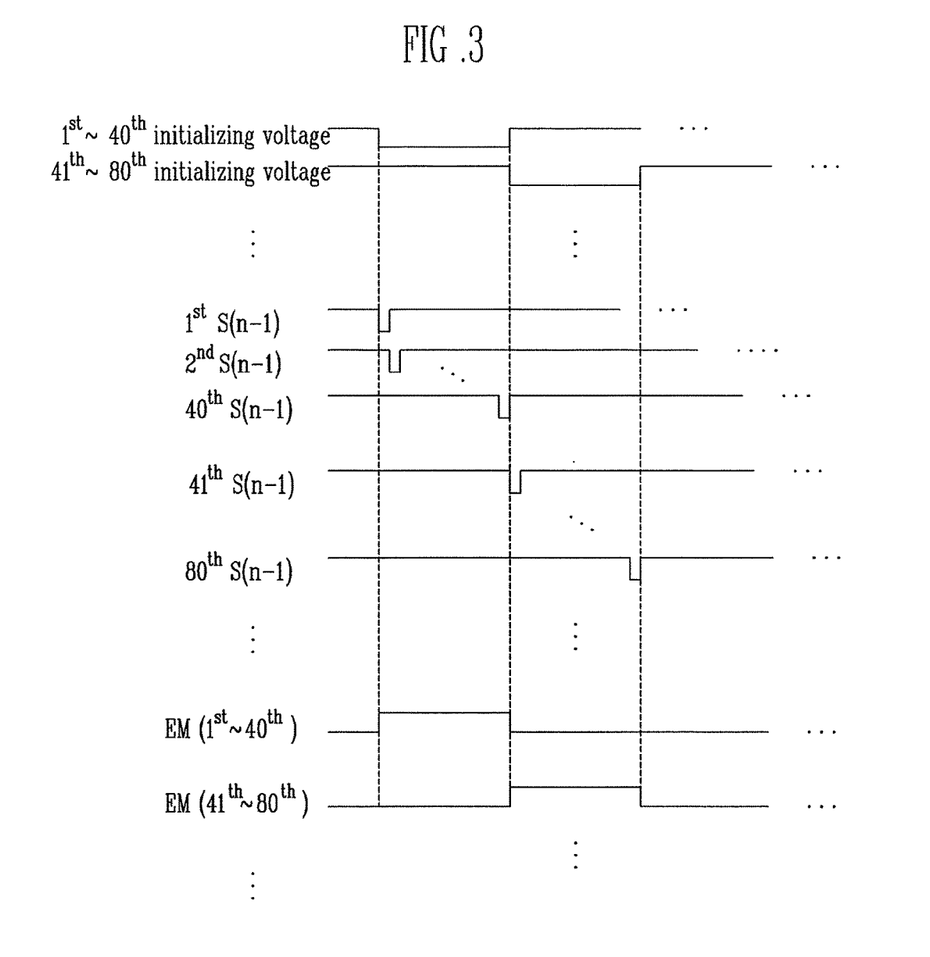
FIG. 3 is a waveform diagram of driving signals supplied to the pixel illustrated in FIG. 2.

As a result, like in the signal waveforms illustrated in FIG. 3, the low level initializing power supply VINT is sequentially applied in synchronization with the previous scan signal applied to the row lines corresponding to each first driving electrode group so that display and touch recognition may be simultaneously realized. In addition, according to the present example embodiment, the scan lines Sn−1 (112b of FIG. 2) to which the previous scan signal S(n−1) is provided may be used as the second driving electrodes (as distinguished from the first driving electrodes).

In the present example embodiment, since all of the transistors included in the pixel 120 of FIG. 2 are PMOS transistors, a scan signal that turns on the transistors has a low level voltage value like the initializing power supply. The scan lines 112b (as the second driving electrodes) are coupled to the gate electrode of the sixth transistor T6 illustrated in FIG. 2. Since scan signals having a low level voltage value like the initializing power supply VINT are sequentially applied to the sixth transistor T6 only in a period where black brightness is displayed, that is, in a period where the fourth transistor T4 is turned off by the emission control signal, display and touch recognition may be simultaneously realized.

According to the present example embodiment, the first driving electrodes 112a formed of the plurality of initialization driving control lines form a group. Also, the scan lines 112b function as the second driving electrodes, distinguished from the first driving electrodes. Thus, touch recognition sensitivity may be improved.

As illustrated in FIG. 3, in a period where the driving signals of the touch screen panel are applied to the initialization driving control lines 112a and the scan lines 112b used as the first and second driving electrodes, a high level emission control signal EM is provided so that corresponding pixels do not emit light. Therefore, according to the present example embodiment, during touch recognition, signals applied to the signal lines, that is, the initialization driving control lines 112a and the scan lines 112b, are input in synchronization with the emission control signal EM applied to the display panel so as not to affect display. Thus, display and touch recognition may be simultaneously performed.

Figure 4:
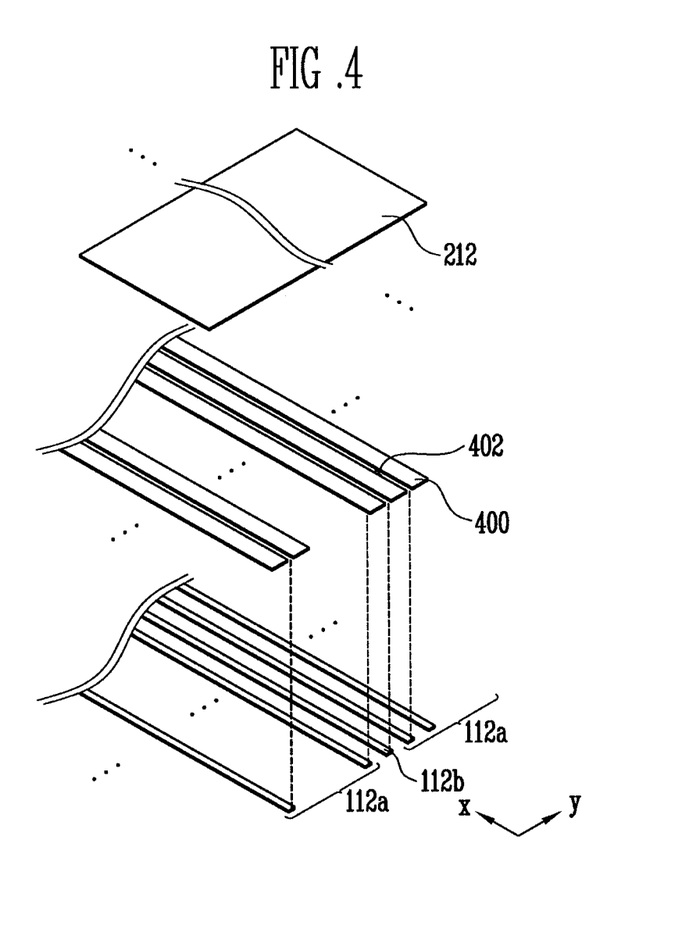
FIG. 4 is a perspective view schematically illustrating driving electrodes and sensing electrodes of a touch screen panel according to an example embodiment.

FIG. 4 is a perspective view schematically illustrating driving electrodes and sensing electrodes of a touch screen panel according to an example embodiment.

In the example embodiment shown in FIG. 4, the first and second driving electrodes are formed of the initialization driving control lines 112a and the scan lines 112b arranged on the bottom substrate 100 in the first direction (the X axis direction). The initialization driving control lines 112a are realized by groups and the scan lines 112b are arranged between the initialization driving control lines 112a realized by groups. The sensing electrodes 212 (corresponding to the first and second driving electrodes 112a and 112b) are formed on one surface of the top substrate 200 in the second direction (the Y axis direction) that intersects the first direction. An insulating layer (not shown) provided between the first and second driving electrodes 112a and 112b and the sensing electrodes 212 and the top substrate 200 function as a dielectric.

In the organic light emitting display according to the present example embodiment, cathode electrodes 400 of the OLEDs may be entirely formed on the initialization driving control lines 112a and the scan lines 112b formed on the bottom substrate 100. It may be difficult to form an electric field between the first and second driving electrodes (realized by the initialization driving control lines 112a and the scan lines 112b) and the sensing electrodes 212. Thus, according to the present example embodiment, apertures 402 are formed in the regions of the cathode electrodes 400 that overlap the initialization driving control lines 112a and the scan lines 112b so that the initialization driving control lines 112a and the scan lines 112b are exposed.

Mutual capacitances CM between the first and second driving electrodes 112a and 112b and the sensing electrodes 212 are formed at the intersections of the first and second driving electrodes 112a and 112b and the sensing electrodes 212. The intersections at which the mutual capacitances CM are formed function as sensing cells that realize touch recognition. The mutual capacitances generated by the sensing cells generate sensing signals coupled by the sensing electrodes 212 coupled to the sensing cells when driving signals are applied to the first and second driving electrodes coupled to the sensing cells, respectively.

Driving signals are sequentially applied to the first and second driving electrodes in one frame period, as described in FIG. 3. When a low level initializing voltage VINT as a driving signal is applied to one of the first driving electrodes, a high level voltage is applied to the remaining first driving electrodes. In addition, when a low level scan signal as a driving signal is applied to one of the second driving electrodes, a high level voltage is applied to the remaining second driving electrodes. Therefore, the mutual capacitances are formed at the plurality of intersections between the first and second driving electrodes to which the driving signals are applied and the plurality of sensing electrodes 212, i.e., in the sensing cells. When a finger contacts each of the sensing cells, a change in capacitance is generated in the corresponding sensing cell so that the change in capacitance may be sensed.

By way of summation and review, methods of realizing a touch screen panel include a resistance layer method, a photo-sensing method, and an electro-capacitive method. Among these, the electro-capacitive touch screen panel senses a change in capacitance formed by a conductive sensing pattern with another peripheral sensing pattern or a ground electrode when a human finger or an object contacts the touch screen panel to convert the contact position into the electrical signal. The electro-capacitive touch screen panel may be attached to the external surface of a flat panel display such a liquid crystal display (LCD) or an organic light emitting display (OLED). However, when the touch screen panel is attached to the external surface of the flat panel display, since an adhesive layer is required between the touch screen panel and the flat panel display and processes of manufacturing the touch screen panel are required in addition to processes of manufacturing the flat panel display, process time and process cost may increase. In addition, in a general flat panel display, the touch screen panel is attached to the external surface of the flat panel display so that the entire thickness of the flat panel display may increase.

As described above, embodiments may provide an organic light emitting display with an electro-capacitive touch screen panel. Embodiments may provide an organic light emitting display integrated with a touch screen panel, in which signal lines arranged in the panel of the organic light emitting display are used as driving electrodes of the electro-capacitive touch screen panel, and signals applied to the signal lines during touch recognition are input in synchronization with signals applied to the display panel so as not to affect display.

Embodiments may also provide an organic light emitting display integrated with a touch screen panel, in which the signal lines uses as the driving electrodes of the touch screen panel are used as initialization driving control lines and scan lines so that touch recognition sensitivity may be improved. The signal lines arranged in the panel of the organic light emitting display may be used as the driving electrodes of the electro-capacitive touch screen panel so that the organic light emitting display with a thin touch screen panel may be realized without additional processes. In addition, during touch recognition, the signals applied to the signal lines are input in synchronization with the signals applied to the display panel so as not to affect display, so that display and touch recognition may be simultaneously performed. In addition, the signal lines used as the driving electrodes of the touch screen panel are used as the initialization driving control lines and the scan lines so that the touch recognition sensitivity may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display, the display comprising:
    a first substrate corresponding to a display panel, the first substrate having pixels and having signal lines coupled to the pixels; and
    a second substrate corresponding to a touch screen panel integrated with the display panel, the second substrate being on the first substrate to seal the first substrate, the second substrate having sensing electrodes of the touch screen panel on a surface thereof, wherein the signal lines include first and second signal lines, the first and second signal lines being arranged in a direction that intersects the sensing electrodes, the first and second signal lines to receive different signals, respectively, and to function as first and second driving electrodes of the touch screen panel, wherein the first and second signal lines are scan lines and initialization driving control lines coupled to respective ones of the pixels, each of the initialization driving control lines is connected to an initializing power supply and a node between a first transistor and a second transistor in each of the pixels, and each of the scan lines is to carry a scan signal different from the initializing power supply and is connected to a gate electrode of the second transistor, wherein the initializing power supply applied to the initialization driving control line has a lower level voltage than that of a data signal applied to each of the pixels.

2. The display as claimed in claim 1, wherein the first signal lines are the initialization driving control lines coupled to the pixels and the second signal lines are the scan lines coupled to the pixels.

3. The display as claimed in claim 2, wherein:
a plurality of adjacent initialization driving control lines form a group, and
the plurality of initialization driving control lines that form the group operate as first driving electrodes of the touch screen panel.

4. The display as claimed in claim 2, wherein scan lines for providing previous scan signals or next scan signals of pixels corresponding thereto operate as second driving electrodes of the touch screen panel.

5. The display as claimed in claim 1, wherein the sensing electrodes are disposed in a display region of the second substrate, corresponding to a region in which the pixels are formed.

6. The display as claimed in claim 5, wherein sensing lines for coupling the sensing electrodes to a touch driving circuit through a touch pad unit are disposed in a non-display region positioned outside the display region.

7. The display as claimed in claim 6, wherein the sensing lines are coupled to the touch driving circuit through a driving pad unit disposed in a non-display region of the first substrate.

8. The display as claimed in claim 7, wherein the touch pad unit is disposed on the second substrate and is coupled to the same touch driving circuit as the driving pad unit disposed on the first substrate.

9. The display as claimed in claim 1, wherein the intersections between the first and second signal lines and the sensing electrodes form respective capacitors, a touch on the touch screen panel to be detected based on a change in capacitance of at least one of the capacitors.

10. The display as claimed in claim 1, wherein a signal to be received by at least one of the first or second signal lines of the display panel is to drive one or more of the sensing electrodes of the touch screen panel.

11. An organic light emitting display, the display comprising:
a first substrate having pixels and signal lines coupled to the pixels; and
a second substrate on the first substrate to seal the first substrate, the second substrate having sensing electrodes of a touch screen panel on a surface thereof, wherein the signal lines include first and second signal lines, the first and second signal lines being arranged in a direction that intersects the sensing electrodes, the first and second signal lines to receive different signals, respectively, and to function as first and second driving electrodes of the touch screen panel, wherein each of the pixels includes:
an organic light emitting diode (OLED) coupled between a first power supply and a second power supply;
a first transistor coupled between the first power supply and the OLED;
a second transistor coupled between a first electrode of the first transistor and a data line;
a third transistor coupled between a second electrode of the first transistor and a gate electrode of the first transistor;
a fourth transistor coupled between the second electrode of the first transistor and an anode electrode of the OLED;
a fifth transistor coupled between the gate electrode of the first transistor and an initialization driving control line corresponding to a respective one of the first signal lines, the initialization driving control line being coupled to a third power supply that is an initializing power supply;
a sixth transistor coupled between the anode electrode of the OLED and the third power supply, the sixth transistor having a gate electrode thereof coupled to a scan line corresponding to a respective one of the second signal lines;
a seventh transistor coupled between the first power supply and the first electrode of the first transistor; and
a storage capacitor coupled between the first power supply and the gate electrode of the first transistor, wherein the initializing power supply applied to the initialization driving control line has a lower level voltage than that of a data signal applied to each of the pixels.

12. The display as claimed in claim 11, wherein the initializing power supply is sequentially applied to respective groups of initialization driving control lines that operate as first driving electrodes of the touch screen panel.

13. The display as claimed in claim 12, wherein a high level voltage is applied to groups of initialization driving control lines except for a group of initialization driving control lines to which the initializing power supply is applied.

14. The display as claimed in claim 11, wherein a scan signal that is applied to the scan line coupled to the gate electrode of the sixth transistor is sequentially applied to scan lines that operate as second driving electrodes of the touch screen panel.

15. The display as claimed in claim 11, wherein:
cathode electrodes of the OLEDs are interposed between a plurality of initialization driving control lines and scan lines arranged on the first substrate and the sensing electrodes arranged on the surface of a second substrate, and
apertures are formed in regions of the cathode electrodes that overlap the initialization driving control lines and the scan lines so that the initialization driving control lines and the scan lines are exposed.

16. An apparatus, comprising:
a first signal line and a second signal line coupled to a pixel; and
a sensing electrode adjacent the signal line;
wherein each of the first and second signal lines form a first plate of a capacitor and the sensing electrode forms a second plate of the capacitor, and wherein a change in capacitance of the capacitor corresponds to detection of a touch on a touch screen panel including the sensing electrode, wherein the first signal line is an initialization driving control line connected to a node between a first transistor and a second transistor in the pixel and the second signal line is a scan line connected to a gate electrode of the second transistor.

17. The apparatus as claimed in claim 16, wherein:
the first and second signal lines are to receive different signals, and
the signals are to drive the touch panel.

\* \* \* \* \*